United States Patent [19]

Chung et al.

[11] Patent Number: 5,001,482

[45] Date of Patent: Mar. 19, 1991

[54] BICMOS DIGITAL-TO-ANALOG CONVERTER FOR DISK DRIVE DIGITAL RECORDING CHANNEL ARCHITECTURE

[75] Inventors: Paul W. S. Chung; David S. Lowrie; Paik Saber; Chorng K. Wang, all of San Jose, Calif.

[73] Assignee: International Business Machines Corporation, Armonk, N.Y.

[21] Appl. No.: 536,431

[22] Filed: Jun. 11, 1990

[51] Int. Cl.$^5$ .......................... H03M 1/00; H03F 3/04
[52] U.S. Cl. .................... 341/136; 341/119; 341/133; 341/135; 330/288
[58] Field of Search ............... 341/119, 133, 135, 136; 323/315, 316, 354; 331/10; 360/44, 39; 330/288

[56] References Cited

U.S. PATENT DOCUMENTS

| | | | |
|---|---|---|---|
| 3,984,830 | 10/1976 | Buchanan et al. | 340/347 |
| 4,045,793 | 8/1977 | Moench | 340/347 |
| 4,064,506 | 12/1977 | Cartwright, Jr. | 340/347 |
| 4,176,344 | 11/1979 | Saari et al. | 340/347 |
| 4,381,497 | 4/1983 | Lillis et al. | 340/347 |
| 4,384,274 | 5/1983 | Mao | 340/347 |
| 4,408,190 | 10/1983 | Nagano | 340/347 |
| 4,431,986 | 2/1984 | Haque et al. | 340/347 |
| 4,546,343 | 10/1985 | Higgins et al. | 341/119 |
| 4,573,005 | 2/1986 | van de Plassche | 323/315 |
| 4,583,076 | 4/1986 | Luschnig | 340/347 |
| 4,594,577 | 6/1986 | Mao | 340/347 |
| 4,644,325 | 2/1987 | Miller | 340/347 |
| 4,675,651 | 6/1987 | Marbot et al. | 340/347 |
| 4,689,607 | 8/1987 | Robinson | 340/347 |
| 4,713,649 | 12/1987 | Hino | 341/133 |
| 4,766,415 | 8/1988 | Dielacher | 341/136 |
| 4,800,365 | 1/1989 | White et al. | 341/119 |
| 4,899,152 | 2/1990 | Barrow et al. | 341/133 |

Primary Examiner—William M. Shoop, Jr.
Assistant Examiner—Helen Kim
Attorney, Agent, or Firm—Baker, Maxham, Jester & Meador

[57] ABSTRACT

A digital-to-analog converter for use in a timing control loop. The converter includes a plurality of cells, each activated in response to a timing loop control signal. The converter also includes a resistive current mirror, with a first resistance R1, providing a reference curent which is mirrored in each cell by a current source FET. Each cell is constructed to switch the current from its current source FET through an output FET when a respective control bit provided to the cell is positive. Otherwise, the current is diverted through a sink FET. All of the cell output FETs are tied to a single resistance R2 which collects the currents of the active cells and provides the AC output of the converter. The converter's output is related only to the ratio R2/R1, thereby decoupling process, temperature, and voltage effects from the output of the converter.

8 Claims, 3 Drawing Sheets

5,001,482

BICMOS DIGITAL-TO-ANALOG CONVERTER FOR DISK DRIVE DIGITAL RECORDING CHANNEL ARCHITECTURE

The invention concerns a recording channel timing loop including a BICMOS DAC (digital-to-analog converter). More particularly, the invention concerns such a loop with a high speed BICMOS DAC whose operational characteristics are insensitive to the effects of process parameters, power supply variations and temperature fluctuations.

Digital recording channels are known in the art for providing the interface between secondary storage devices such as Winchester disks in computing systems. For example, a typical, Partial Response Maximum Likelihood (PRML) digital-analog magnetic recording channel digitizes an analog signal read from a disk to recover data from the signal. The channel also drives a write circuit with an encoded digital signal for storage of data on the disk in analog form.

Such a channel includes a clock signal source which provides a read-write clock utilized in channel read an write operations. The stability of the clock signal is all important in reducing errors which channel operations impose on data. The read-write clock is used to sample the read signal as well as to clock digital logic, control logic, and equalizing circuitry in the channel.

The stability of the read-write clock is immediately affected by components of the clock source. Typically, a timing loop responsive to read data is responsible for generating the clock; such a loop may include a voltage-controlled oscillator (VCO) that varies the clock frequency in response to digitization process parameters such as quantization error resulting from conversion of the read analog signal to a digital equivalent. The error is processed, converted to an analog form, and fed back as an error signal to the VCO to adjust clock frequency.

Digital-to-analog conversion of recording channel frequency error is normally performed by a digital-to-analog converter (DAC). As the speed with which the recording channel operates increases, the effects of process, supply, and temperature variations on a DAC also increase. Variation in DAC operation due to process tolerance, supply, and temperature changes can easily alter the acquisition and tracking range of a channel timing loop by as much as 50%. Such variation can result in an indication of recording channel failure. Thus, a DAC with a very low output variation is in high demand for reliable recording channel operation. Furthermore, the DAC has to be capable of switching at high frequency with small settling time at its output in order to meet high data requirements of modern recording channels.

SUMMARY OF THE INVENTION

The invention has the principal objective of providing a disk drive digital recording channel with a highly stable read-write clock source.

An advantage provided by the invention described an claimed in this application is found in a DAC having a very low output variation which supports reliable recording channel operation.

The invention concerns a BICMOS DAC for recording channel timing loop. Relatedly, recording channel circuitry is typically provided in the form of one or more monolithic integrated circuits which include, among other components, a timing control loop. In the invention, a timing control loop in a monolithic recording channel device includes an analog to digital converter (ADC) which converts channel read signals to digital samples in response to a channel clock signal, the digital samples being converted at a rate determined by a frequency of the channel clock signal. An oscillator is connected to the ADC to provide a channel clock signal, the channel clock signal having a frequency corresponding to the difference between an ideal signal level and ADC output samples. A quantization error component connected to the ADC produces a digital timing correction (DTC) signal having a magnitude determined by a phase error in the digital signal and quantization error due to digital processing of the signal. In combination with these components, the invention includes a converter connected to the quantization component and to the oscillator which provides the error signal at a level based upon the magnitude of the DTC, the converter including a resistive current mirror source with a first resistance R1, and an output section with a second resistance R2, the level of the error signal being determined substantially by the product of the magnitude of the DTC signal and the ratio R2/R1.

In limiting the converter's production of the error signal to a value which embraces only two resistive parameters (R1 and R2), the converter exhibits a very low output variation in the face of process tolerance, and supply and temperature changes, thereby enhancing the stability of the timing loop.

DETAILED DESCRIPTION OF THE PREFERRED EMBODIMENTS

Figure 1:
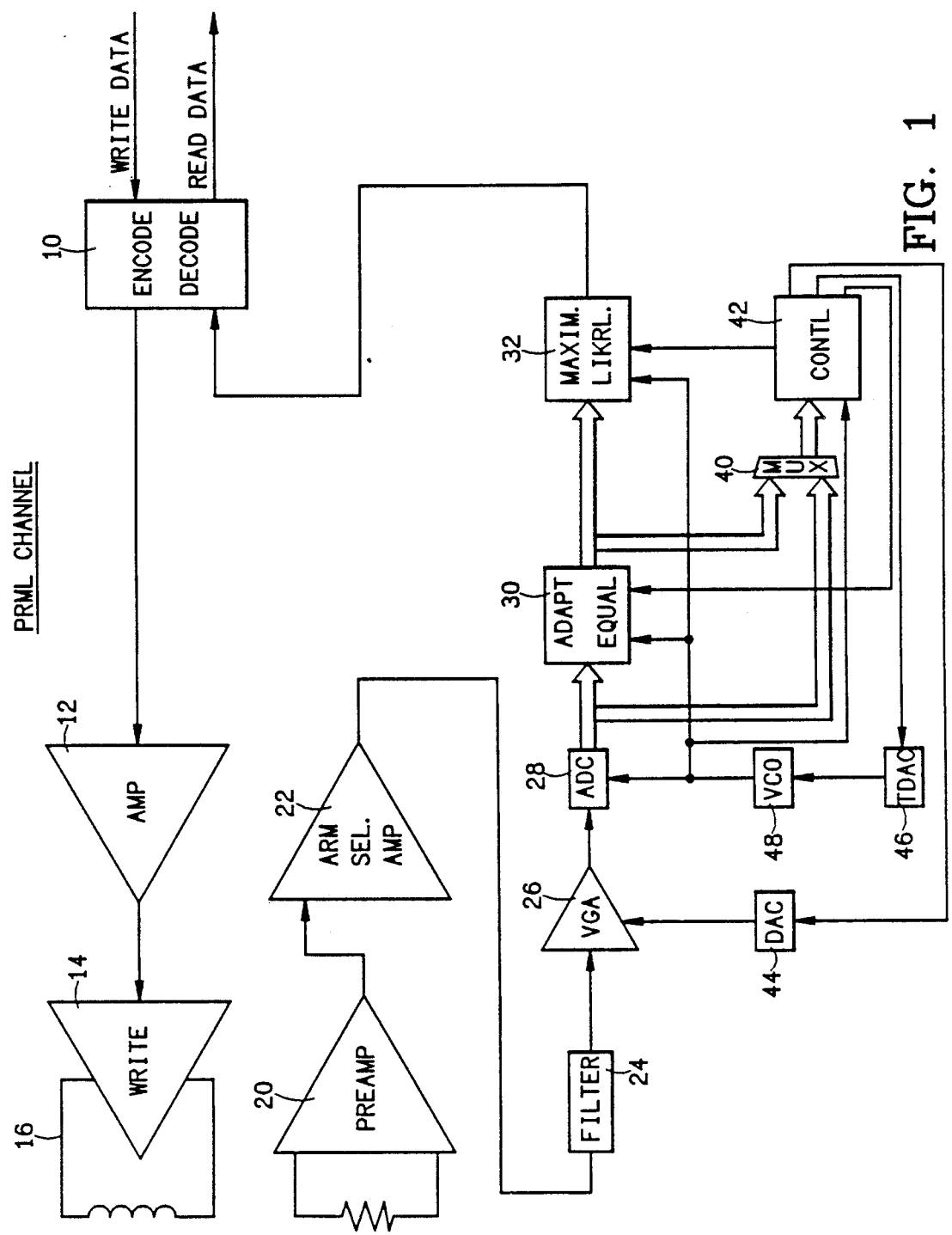
FIG. 1 is a block diagram illustrating a high speed PRML digital analog magnetic recording channel with a read-write clock source.

The invention concerns a recording channel timing loop provided in a monolithic integrated circuit of the BICMOS kind. As is known, such circuitry includes BJT and CMOS elements. FIG. 1 illustrates a partial response maximum likelihood (PRML) digital/analog magnetic recording channel including a read-write clock source. Such a channel is normally found in the interface between a direct access storage device such as a hard disk and an I/0 component of a computer system. Across this interface, the channel exchanges digital data with the I/0 component, receiving data to be stored on ("written to") the hard disk and providing data obtained from ("read from") the disk. The data being written to the disk is referred to as "write data", while the data read from the disk is referred to as "read data". Data is stored on the disk in a coded format selected to maximize storage density. Therefore, the channel includes an encode/decode component 10 which receives write data from the I/0 component and encodes it in preparation for being written to the disk by way of a select amp 12, a write amplifier 14, and a transducer 16.

Data is read from the disk by way of a preamplifier 20, arm select amplifier 22, equalizer filter 24, and variable gain amplifier (VGA) 26. Together, these components detect, amplify, and shape the low-level analog signal obtained from the disk. An analog-to-digital converter (ADC) 28 converts the analog output of the amplifier 26 to digital data which is processed through an adaptive equalizer 30 and a maximum liklihood detector 32. The output of the maximum liklihood component 32 is encoded digital data which is decoded at 10 and passed as read data to the I/0 component.

The read portion of the channel also includes two major control loops: a gain control loop and a timing control loop.

The gain control loop takes the output of the ADC 28 after processing by the adaptive equalizer 30 back to the VGA through a multiplexer 40, a control circuit 42, and a digital-to-analog converter 44. The equalized samples are converted by the DAC 44 and provided to the variable gain control input of the amplifier 26.

The timing control loop is responsible for generation the read-write clock, which is used to sample the read signal from the disk, as well as to clock the digital logic, the adaptive equalizer, and the control logic in the PRML channel. The timing control loop consists essentially of the ADC 28, timing control logic in the control circuit 42, which receives the output of the AD through the multiplexer 40, a timing digital-to-analog converter (TDAC) 46, and a voltage controlled oscillator (VCO) 48. The output of the VCO 48 is the read-write clock.

The timing control loop calculates a digital timing correction (DTC) signal based upon the samples produced by the ADC 28. The information in the DTC signal is used to lock the VCO 48 to the data being read from a disk. To calculate phase error, the output samples of the ADC 28 are compared, by the control circuit 42, against ideal output samples, and the difference is accumulated in a quantization error feedback circuit. The quantization error feedback circuit maintains an 18-bit accumulator whose 14 least significant bits are incremented each time the quantization error exceeds the predetermined value. The DTC signal consists of the most significant 4 bits of the accumulator, which get incremented directly or when the 14 lower bits of the accumulator add up to the least significant bit of the DTC signal. The DTC signal is used as the input to the TDAC 46, so that each time the DTC is updated, the input control to the TDAC 46 changes, which causes a change in the voltage output by the TDAC 46. Such output, in turn, changes the frequency of the read-write clock output by the VCO 48, which changes the ADC output signals. This process continues until a precise lock onto incoming data is achieved.

Figure 2:
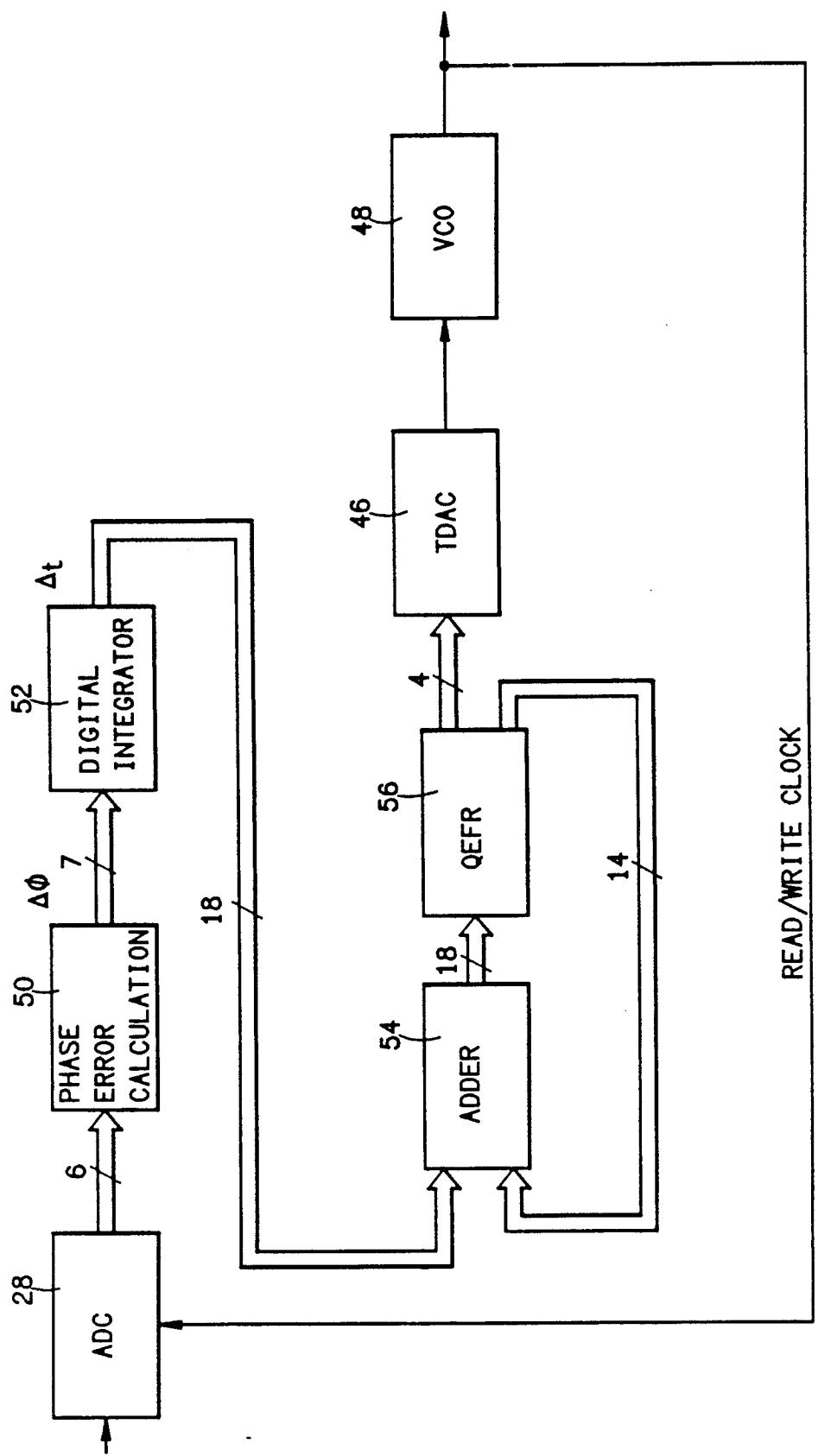
FIG. 2 is a block diagram illustrating, in more detail than FIG. 1 a timing control loop in the PRML recording channel of FIG. 1.

FIG. 2 is a schematic diagram illustrating the timing control loop in more detail. The loop consists of the ADC 28, the TDAC 46, and the VCO 48. Connected between the ADC 28 and the input of the TDAC 46 are components 50, 52, 54, and 56, which are included in the control circuit (block 42 in FIG. 1). During the read operation, the analog signal obtained from the disk is processed and fed into the ADC 28 which converts it to a 6-bit digital signal fed to the phase error calculator 50. The ADC 28 operates conventionally in response to the read-write clock produced by the VCO 48 and the analog signal. The phase error calculator detects the difference between the ADC output and an ideal hardcoded output and generates a +/− timing phase error. The magnitude of the timing phase error is a 7-bit digital signal, which is integrated by a ditigal integrator 52. Integration of a phase error results in a frequency change, which is output as an 18-bit digital word by the integrator 52. The frequency change signal is added by digital adder 54 with the present contents of a quantization error feedback register (QEFR) 56. The register is an 18-bit register whose 4 high order bits constitute the DTC signal. The 4-bit DTC signal is provided to the TDAC 46. As these 4 bits change, the analog signal produced by the TDAC 46 changes, thereby altering the frequency of the read-write signal produced by the VCO 48. This frequency is a primary control input to the ADC 28; when altered, it alters the rate of conversion of the ADC, thereby adjusting the phase error detected by the calculator 50. The 14 lower bits of the QEFR 56 are the quantization error magnitude, which is fed back with one cycle delay to the adder 54, which combines it with the frequency change signal produced by the integrator 52 during the following cycle. By saving the quantization errors in the QEFR 56 and adding them to a following cycle sample, the influence of the quantization error on the variance of the VCO frequency is reduced.

Contemplation of the timing loop illustrated in FIG. 2 will bring home to the reasonably skilled artisan the importance of stability in the TDAC 46. The change of the LSB of the 4-bit signal input to the TDAC corresponds to a frequency change in the read-write signal output by the VCO 48. If the frequency changes are larger than a maximum frequency change allowed by the timing loop gain, the error between the ADC samples and the ideal samples calculated at 50 will not decrease, thereby causing failure to lock. The frequency change may end up to be larger than the maximum frequency change allowed by the overall loop gain if the LSB sensed by the TDAC 46 is not a constant value. For example, assume operation of the VCO 48 at 100 MHz with a desired TDAC LSB of 10 millivolts corresponding to a maximum frequency exchange of 1.0 MHz. Under these conditions, the VCO 48 will be able to precisely lock onto disk data. Now, assume that process parameters cause the TDAC LSB size to increase by 40% (LSB=14 mv). Because of the linear relation between VCO frequency and its control input signal, a 40% increase in the maximum frequency change (1.4 MHz) would result. Such a large change in the maximum allowed delta frequency will cause lock-to-data failure in the recording channel. This is referred to as a HARD ERROR, which renders the storage device inoperable. Furthermore, the output range of the TDAC 46 is directly related to the tracking range, the range where the VCO 48 can sustain the locked incoming data after initial lock. If process variation in the TDAC 46 changes so that the LSB reduces to a minimum value, this would reduce the available VCO tracking range, causing the loss of the lock-to-data. This loss requires a POWER ON RESET by the storage device operator. Therefore, constant value of the TDAC LSB under all process, temperature, and voltage supply conditions is a necessary requirement for reliable operation of the PRML recording channel illustrated in FIG. 1.

Figure 3:
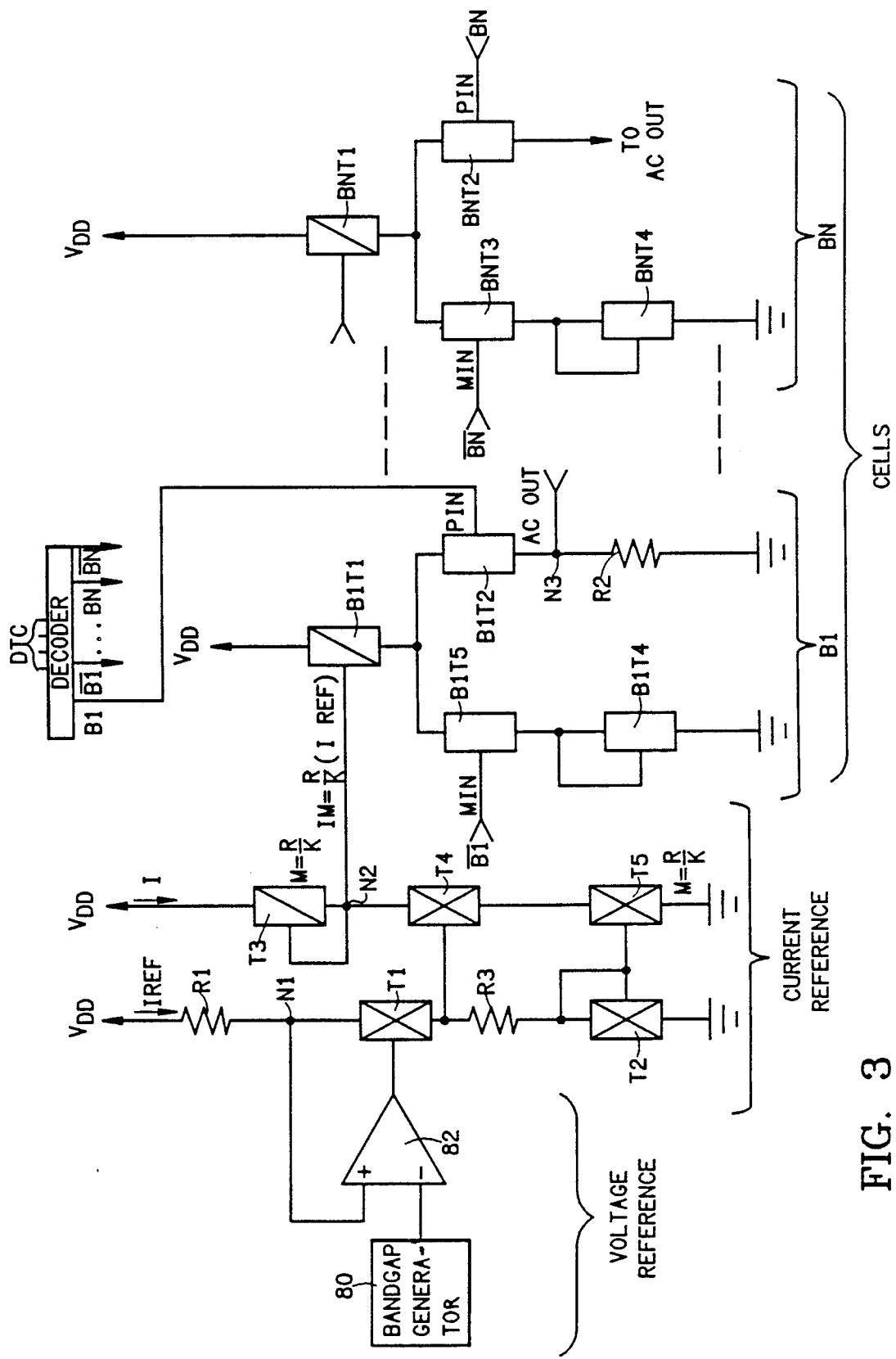
FIG. 3 is a circuit diagram illustrating a high speed stable DAC used in the timing loop of FIG. 2.

Refer now to FIG. 3 for an understanding of a novel design for the TDAC 46 in the timing control loop of the recording channel. As just related, the control voltage of the VCO 48 is supplied by the output of the TDAC, and variation of the TDAC output due to variation in the TDAC LSB value can easily alter the required acquisition an tracking range of the channel timing control loop by more than 50%. Thus, the TDAC 46 must provide very low output variation, yet be capable of switching at a high frequency with small output settling time in order to meet the high data rate requirement of modern high speed recording channels. The novel design of the TDAC illustrated in FIG. 3 addresses the variance problem with a solution which allows the device to operate up to the technological limit of BICMOS technology.

In prior art DAC designs, tightly controlled output is achieved by use of external components such as actively trimmed resistors which are used to set the reference current or voltage that controls the magnitude of the LSB for the converter. Such an implementation is costly and time-consuming. Its accuracy is also limited by the trimming step size. A requirement, therefore, exists to achieve very low DAC output voltage variation to ensure a predictable capture and tracking range for a timing loop without the use of external components.

The TDAC includes three sections, a voltage reference section, a current reference section, and N output cells, labeled B1 through BN. In the context of FIG. 3, N=15.

The voltage reference section includes a band gap voltage generator 80 conventionally constructed using BICMOS technology to achieve +/−1% process tolerance and less than 50 PPM/° C. temperature coefficient. The output of the generator 80 is fed into the inverting input of a conventional BICMOS operational amplifier 82. The output of the amplifier is connected to the gate of an FET, while the non-inverting input of the operational amplifier 82 is connected at node N1 to the drain of the FET.

The current reference portion of the TDAC includes low threshold, N-channel FETs T1, T2, T4, and T5. The transistor T3 is a standard P-channel FET. In the current reference portion of the TDAC, the band gap generator 80 and operational amplifier 82 together set the voltage at the node N1 to a voltage level of VBG volts, where VBG is the band gap voltage produced by the generator 80. The tolerance of the voltage level at node N1 is completely dependent on the band gap voltage process and temperature tolerances. As stated above, a BICMOS band gap voltage reference can achieve +/−1% process tolerance and less than 50 PPM/° C. temperature coefficient. Therefore, the voltage variation at node N1 is about +/−1% of desired voltage level. A resistor R1 is tied between the supply $V_{DD}$ and the drain of transistor T1 to establish a reference current IREF where IREF=$(V_{DD}-V_{BG})$/R1. Resistor R1 is an on-chip ion implant resistor.

The transistors T1-T5 are interconnected in a current mirror configuration where the current IREF flowing in the left-hand leg of the circuit (comprising the transistors T1 and diode-connected transistor T2) is partially "mirrored" in the right-hand leg of the circuit (comprising transistors T3, T4, and T5). In the left-hand leg of the current reference circuit, the transistor T1 has its drain connected to node N1, its gate to the output of the amplifier 82, and its source in common with the gate of T4 to one lead of a resistor R3. The other lead of the resistor R3 is connected in common with the drain and the gate of the transistor T2, whose source is tied to ground. In this circuit, transistor T2 comprises R equally-sized FET devices which divide the reference current IREF into R equal valued currents. I the preferred embodiment, R is equal to 16. The R transistors are identically diode-connected, with their common connections represented by the diode configuration of T in FIG. 3. Provision of R transistors finely divides the reference current among the R transistors. The plurality of parallel devices reduces the effect which mismatches between any two of the devices might have on the mirroring of the reference current. As is known, a common problem in current mirroring with field effect transistors is variation in threshold voltages. By dividing the transistor which generates the voltage establishing the mirroring current magnitude, variations in threshold values between T2 and T5 will be reduced.

In the right-hand ("mirroring) leg of the current reference circuit, transistors T3, T4, and T5 are connected together, with the drain of transistor T3 connected to the drain potential and the gate and source of the transistor T3 connected, at node N2, to the drain of transistor T4. The source of the transistor T4 is connected to the drain of transistor T5, whose source is grounded and whose gate is connected in common with the gate and drain of the reference transistors T2. In this leg, the mirroring transistor T5 is subdivided into K separate transistors connected in parallel as shown in FIG. 3. Thus, a fraction of the reference current is mirrored in each of the K transistors comprising the transistor T5. As is known, in MOS design, the ratio of the reference current in transistor T2 to the output current in transistor T5 is set by the ratio of devices widths to device length $(W/L)_{T2}/(W/L)_{T5}$. In the preferred embodiment, the T5 devices have the same width and length as the T2 devices. Since the actual channel length achieved can vary substantially due to etching variations, current ratio is most accurately achieved when the devices have the same channel length and the current ratio is set by channel width. Thus, the ratio M of output current to reference current is set by the ratio of the number of T5 devices to the number of T2 devices, that is, M=K/R. Therefore, the mirror current IM flowing in the right-hand leg of the current reference circuit is given by:

$$IM=(K/R)IREF \qquad (1)$$

In the current reference circuit, the transistor T3 is a P-channel FET device with its gate and drain tied together at node N2. Node N2 is the current mirror output node which provides the reference input for the TDAC bit cells.

Resistor R3 performs an important function in the current reference circuit. In actual operation, without R3, the drains of transistor T2 and T5 would not be at the same voltage. Resultantly, the mirror current in transistor T5 would be somewhat different from the reference current in transistor T2. In order to reduce the difference, the resistor R3, connected to the drain of the transistor T2, has an ohmic value which equalizes the drain voltages of the transistors T2 and T5. This produces a mirror current which accurately reflects the reference current.

In FIG. 3, there are N bit cells labeled as B1-BN. In the preferred embodiment of the timing loop described above, N=15. The bit cells are identical, therefore, only cell B1 will be described in detail.

Bit cell B1 is a 4-device cell in which a reference current transistor B1T1 is a P-channel FET operating as a current source by mirroring current from the right-hand leg of the current reference circuit. The device B1T1 mirrors a cell current IC, wherein IC=IM/K. Transistors B1T2, B1T3, and B1T4 are N-channel FETs which steer the reference current IC between an output resistor R2 and ground. In FIG. 3, the current source transistor B1T1 has its gate tied in common with the gate of T3, its source connected to the supply voltage $V_{DD}$, and its drain connected in parallel to the drains of the transistors B1T3, B1T2. The source of the transistor B1T3 is tied in common with the gate and drain of the transistor B1T4, and the source of transistor B1T4 is grounded. The source of the transistor B1T2 is tied to one end of output resistor R2 whose other end is grounded. All of the transistors in the N−1 other cells of the TDAC which correspond with the transistor B1T2 have their sources tied in common at node N3 with the source of transistor B1T2. The node N3 collects together all of the output currents which are summed across the resistor R2 to provide the output voltage, labeled as AC OUT in FIG. 3.

Control signals for the bit cells are identically labeled in FIG. 3 as NIN and PIN. The control signals for these inputs are derived from a 4-to-15 decoder 60 which receives the four bits of the DTC signal and converts them into 15 complementary pairs of output signals. Each output signal pair is labeled to signify the cell to which it is connected. Thus, the cell B1 receives output B1 and its complement B1 from the decoder 60. The positive value of B1 is connected to input PIN of cell B1, while its complement is connected to input NIN of the cell. When bit B1 is active, the transistor B1T2 is turned on, while the transistors B1T3 and B1T4 are off. When the transistor B1T2 is on, the cell current IC flows through node N3, contributing to the voltage drop on resistor R2.

When the bit B1 is "off", the signal PIN is ground, while the signal NIN has a positive value. This steers the cell current IC to ground through the transistors B1T3 and B1T4.

The 4-to-15 decoder 60 is constructed in a conventional manner to binarily weight the cells of the TDAC. In this regard, when the DTC signal has a value of 0, all of the complemented bits are set to a CMOS logic level of "1" while the positive sense outputs are all at CMOS "0". Then, as the DTC signal bits are set, the decoder 60 "turns on" corresponding combinations of 1, 2, 4, and 8 cells.

The resistor R2 is an ion inplant resistor formed in the monolithic integrated circuit including the TDAC. The output current of the TDAC, which is the sum of all currents whose cells' PIN signals are "ON", is sensed by the resistor R2, thus providing the AC output voltage. The transistors T4 in the bit cells act like resistive loads for the T3 transistors to ensure comparable voltages at the node N3 and the sources of the BNT3 transistors, thereby minimizing "glitches" at the output node N3 at the time of switching.

The bit cells are designed so that the T2 and T3 transistors not only steer the cell currents between the output resistor R2 and ground when cell inputs are switching in complementary fashion, but also operate as source followers by having these devices operate within their saturation regions at all times when they are on. This way, maximum current for a given gate-to-source voltage is guaranteed to drive the output impedance. As is known, the IV characteristics of a N-channel FET device show that the device output current is highest when the device is in the saturation region for a given quiescent point. Furthermore, a source follower gives the advantage of a broad bandwidth in which the pole frequency is basically governed by the $g_m$ and $C_{gs}$ of the device; that is, $f = g_m/(2\pi C_{gs})$ the pole frequency is the device cutoff which is technology-dependent. This frequency can be in the gigahertz range, implying that the bit cell performance of the TDAC illustrated in FIG. 3 surpasses the conventional CMOS DAC bit cell design. Theoretically, by appropriate scaling of the technology, the upper frequency range can be increased for a higher data rate recording channel.

Since the voltage at the node N1 is held constant within $+/-1\%$, the reference current IREF is solely dependent upon the temperature coefficient of the resistor R1. Typically, for ion-implanted resistors and monolithic circuits, this coefficient is $0.2\%/°C$. As is known, the process tolerance for such a resistor is in the order of $+/-16\%$. Thus, in general, a given reference current of IREF can change by more than $+/-32\%$ due to change in these parameters. In a conventional DAC design, such a large change in the reference current causes the same percentage of change in DAC output current, resulting in large output voltage changes. However, in the design of the TDAC illustrated in FIG. 3, it can be shown that the output voltage is insensitive to these changes as shown below. Consider the output voltage $V_{out}$ given by the equation (2):

$$V_{out} = \left(\frac{V_{CC} - V_{BG}}{R1}\right)\left(\frac{W_{T5}}{W_{T2}}\right)\left(B1\left(\frac{W_{B1T1}}{W_{T3}}\right) + B2\left(\frac{W_{B2T1}}{W_{T3}}\right) + \ldots + B(N)\left(\frac{W_{BNT1}}{W_{T3}}\right) + \right) \times R2 \quad (2)$$

which can be written as:

$$V_{out} = \left(\frac{V_{CC} - V_{BG}}{R1}\right)\left(\frac{W_{T5}}{W_{T2}}\right)\left(\sum_{I=1}^{N} \frac{BIW_{BIT1}}{W_{T3}}\right) \times R2 \quad (3)$$

or $$V_{out} = (V_{CC} - V_{BG})\left(\frac{W_{T5}}{W_{T2}}\right)\left(\sum_{I=1}^{N} \frac{BIW_{BIT1}}{W_{T3}}\right) \times \frac{R2}{R1} \quad (4)$$

Equation (4) is the product of four terms. By examining each term separately, one can derive the accuracy, tolerance, and the temperature coefficient of this TDAC design. The two outside terms dictate the tolerance of the output voltage. Considering that tolerance of $V_{CC}-V_{BG}$ is within $+/-1\%$ and R2/R1 tolerance can be controlled within 1% with careful layout, the total tolerance on the output voltage is within $+-2\%$. The two inside terms control the number of bit accuracy which varies from technology to technology. However, $W_{T5}/W_{T2} = 1/256$ is attainable in 3-micron technology or better. Referring back to equation (4), it can be shown that the TDAC output voltage temperature coefficient is given by:

$$V_{out}TC = (V_{CC} - V_{BG})TC + \left(\frac{W_{T5}}{W_{T2}}\right)TC + \sum_{I=1}^{N}\left(\frac{BIW_{BIT1}}{W_{T3}}\right)TC - \left(\frac{R2}{R1}\right)TC \quad (5)$$

Note that in equation (5), the temperature coefficient of second, third, and fourth terms are zero. The temperature coefficient of the first term is simply the bandgap temperature coefficient. Therefore, TDAC temperature coefficient is simply bandgap temperature coefficient.

The DAC supply coefficient can be shown to be:

$$V_{out}\delta V_{CC} = \left[(V_{CC} - V_{BG})^2 \delta V_{CC} + \left(\frac{W_{T5}}{W_{T2}}\right)^2 \delta V_{CC} + \sum_{I=1}^{N}\left(\frac{BIW_{BITI}}{W_{T3}}\right)^2 \delta V_{CC} + \left(\frac{R2}{R1}\right)^2 \delta V_{CC}\right]^{\frac{1}{2}} \quad (6)$$

In this equation, the second, third, and fourth terms are all zero. So the supply coefficient is the function of $(V_{CC}-V_{BG})\delta VCC$. However, the bandgap is designed in such a way so its output varies one to one with respect to the power supply changes, so for ideal conditions:

$$\frac{\delta(V_{CC} - V_{BG})}{\delta V_{CC}} = 0 \quad (7)$$

which shows that the above design is also independent of the power supply changes.

While we have described several preferred embodiments of our digital-to-analog converter, it should be understood that modifications and adaptations thereof will occur to persons skilled in the art. Therefore, the protection afforded our invention should only be limited in accordance with the scope of the following claims.

We claim:

1. In a monolithic recording channel device, which includes a timing control loop that converts channel read signals at a channel clock rate which is adjustable in response to a loop error signal and which produces a digital timing correction (DTC) signal having a magnitude determined by a read signal conversion error, a digital-to-analog converter for providing the loop error signal, the converter comprising:
    a band gap voltage generator means for providing a band gap voltage $V_{BG}$;
    a resistive current source means which includes a resistor R1 with a first lead for connecting to a supply voltage $V_{DD}$, and a second lead connected to the band gap voltage generator means for generating a reference current $IREF=(V_{DD}-V_{BG})/R1$, the current source means for generating a source current IM in response to IREF;
    a plurality of cells, each cell including a source FET connected to the resistive current source for generating a cell current IC in response to source current IM, an AC output node, and switching means responsive to the DTC signal for switching the cell current IC to a voltage reference or to said AC output node; and
    an output resistor R2 which is connected to the AC output nodes of all said cells.

2. The converter of claim 1, wherein each of said cells includes a node N connected to the source FET of the cell, a first CMOS transistor having a drain connected to said node N, a gate connected to receive the DTC signal, and a source connected to the cell's AC output node, and second and third CMOS transistors, the second CMOS transistor having a drain connected to said node N, a gate connected to receive said DTC signal, and a source, the third CMOS transistor having a drain and a gate connected to the source of the second CMOS transistor and a source connected to a reference voltage.

3. The converter of claim 1 wherein the resistive current source means includes reference current and mirror current legs, the reference current leg including a resistor R3 and first and second CMOS transistors, the first CMOS transistor having a drain connected to the second lead of resistor R1, a gate connected to the bandgap voltage generator, and a drain connected to a first lead of resistor R3, the second CMOS transistor having a gate and drain connected to a second lead of the resistor R3 and a source connected to a voltage reference, the mirror current leg including third, fourth, and fifth CMOS transistors, the third CMOS transistor having a gate, a source, and a connected to the supply voltage $V_{DD}$, the fourth CMOS transistor having a drain connected to the gate and source of the third CMOS transistor, a gate connected to the first lead of the resistor R3, and a source, and the fifth CMOS transistor having a drain connected to the source of the fourth CMOS transistor, a gate connected to the second lead of the resistor R3, and a source connected to said reference voltage.

4. The converter of claim 3, wherein the second CMOS transistor includes R identically-connected, parallel CMOS transistors, and the fifth CMOS transistor includes K identically-connected, parallel CMOS transistors, the mirror current IM being given by: IM=(K/R)IREF.

5. A digital-to-analog converter for analog conversion of an N-bit digital signal comprising:
    a voltage generator for providing a voltage $V_{BG}$;
    a resistive current source means which includes a resistor R1 with a first lead for connecting to a supply voltage $V_{DD}$, and a second lead connected to the generator to generate a reference current $IREF=(V_{DD}-V_{BG})R1$, the current source means for generating a source current IM in response to IREF;
    a plurality of cells, each cell including a source FET connected to the resistive current source for generating a cell current IC in response to mirror current IM, an AC output node, and switching means responsive to a respective bit of the N-bit digital signal for switching the cell current IC to a voltage reference or to said AC output node; and
    an output resistor R2 which is connected to the AC output nodes of all said cells, wherein the voltage magnitude at said AC output node is determined substantially by the product of the magnitude of the N-bit digital signal and the ratio R2/R1.

6. The converter of claim 5, wherein each of said bit cells includes a node connected to the source FET of the cell, a first CMOS transistor having a drain connected to the source FET, a gate connected to receive a respective one of said N bits, and a source connected to the cell's AC output node, and a second and third CMOS transistors, the second CMOS transistor having a drain connected to said source FET, a gate connected to receive a complement of said respective one of said N bits, and a source, the third CMOS transistor having a drain and a gate connected to the source of the second CMOS transistor and a source connected to a reference voltage.

7. The converter of claim 5, wherein the resistive current source means includes reference current and mirror current legs, the reference current leg including a resistor R3 and first and second CMOS transistors, the first CMOS transistor having a drain connected to the second lead of resistor R1, a gate connected to the voltage generator, and a source connected to a first lead of resistor R3, the second CMOS transistor having a gate and drain connected to a second lead of the resistor R3 and a source connected to a voltage reference, the mirror current leg including third, fourth, and fifth CMOS transistors, the third CMOS transistor having a gate, a source, and a drain connected to the supply voltage $V_{DD}$, the fourth CMOS transistor having a drain connected to the gate and source of the third CMOS transistor, a gate connected to the first lead of the resistor R3, and a source, and the fifth CMOS transistor having a drain connected to the source of the fourth CMOS transistor, a gate connected to the second lead of the resistor R3, and a source connected to said reference voltage.

8. The converter of claim 7, wherein the second CMOS transistor includes R identically-connected, parallel CMOS transistors, and the fifth CMOS transistor includes K identically-connected, parallel CMOS transistors, the mirror current IM being determined by: IM=K/R(IIEF).

* * * * *